United States Patent
Qin et al.

(10) Patent No.: US 9,905,577 B2
(45) Date of Patent: Feb. 27, 2018

(54) ARRAY SUBSTRATE, FLEXIBLE DISPLAY DEVICE AND METHOD FOR MANUFACTURING ARRAY SUBSTRATE

(71) Applicant: BOE TECHNOLOGY GROUP CO., LTD., Beijing (CN)

(72) Inventors: Wei Qin, Beijing (CN); Weifeng Zhou, Beijing (CN); Hongfei Cheng, Beijing (CN); Jing Su, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 14/408,518

(22) PCT Filed: Apr. 14, 2014

(86) PCT No.: PCT/CN2014/075262
§ 371 (c)(1),
(2) Date: Dec. 16, 2014

(87) PCT Pub. No.: WO2015/032202
PCT Pub. Date: Mar. 12, 2015

(65) Prior Publication Data
US 2016/0268313 A1    Sep. 15, 2016

(30) Foreign Application Priority Data

Sep. 4, 2013    (CN) .......................... 2013 1 0397916

(51) Int. Cl.
*H01L 23/538*    (2006.01)
*G02F 1/1333*    (2006.01)
(Continued)

(52) U.S. Cl.
CPC .... *H01L 27/1218* (2013.01); *G02F 1/133305* (2013.01); *G09G 5/003* (2013.01);
(Continued)

(58) Field of Classification Search
CPC ............. H01L 23/5387; H01L 23/4985; H01L 25/0657; H01L 25/04; H01L 27/1218;
(Continued)

(56) References Cited

U.S. PATENT DOCUMENTS

| | | | |
|---|---|---|---|
| 5,502,937 A | * | 4/1996 | Wilson .................... E04B 1/948 52/273 |
| 2008/0042940 A1 | * | 2/2008 | Hasegawa ............... G02F 1/167 345/76 |

(Continued)

FOREIGN PATENT DOCUMENTS

| CN | 2674576 Y | 1/2005 |
|---|---|---|
| CN | 102156360 A | 8/2011 |

(Continued)

OTHER PUBLICATIONS

International Search Report and Written Opinion dated Apr. 14, 2014 regarding PCT/CN2014/075262.

(Continued)

*Primary Examiner* — Galina Yushina
(74) *Attorney, Agent, or Firm* — Harness, Dickey & Pierce, P.L.C.

(57) ABSTRACT

The present disclosure provides an array substrate, a flexible display device, and a method for manufacturing an array substrate. The array substrate includes a flexible substrate arranged at a display region and a peripheral region, and an array layer formed on the flexible substrate. The flexible substrate arranged at the display region has a first thickness, and at least a portion of the flexible substrate arranged at the peripheral region has a second thickness greater than the first thickness. According to the array substrate of the present disclosure, the flexible substrate arranged at the peripheral region is provided with a thickened portion so as to meet the strength requirement of an unfoldable region. Meanwhile, the thickened portion can be formed in a single process (Continued)

through a base plate having a corresponding concave structure, and as a result, it is able to reduce the process complexity.

18 Claims, 8 Drawing Sheets

(51) Int. Cl.
  *H01L 27/12* (2006.01)
  *G09G 5/00* (2006.01)
  *H01L 25/065* (2006.01)
  *H01L 25/00* (2006.01)

(52) U.S. Cl.
  CPC ...... *H01L 23/5387* (2013.01); *H01L 25/0657* (2013.01); *H01L 25/50* (2013.01); *H01L 27/1214* (2013.01); *H01L 27/1266* (2013.01); *G02F 1/1333* (2013.01); *G09G 2380/02* (2013.01)

(58) Field of Classification Search
  CPC ............ H01L 27/1266; H01L 27/1214; H01L 2021/775; G02F 1/1333; G02F 1/133305; G02F 2001/133388; G09G 5/003; G09G 2380/02
  See application file for complete search history.

(56) References Cited

U.S. PATENT DOCUMENTS

| | | | |
|---|---|---|---|
| 2009/0244456 A1 | 10/2009 | Miyazaki et al. | |
| 2010/0053535 A1 | 3/2010 | Kim et al. | |
| 2010/0066951 A1* | 3/2010 | Kuo | G02F 1/133305 349/106 |
| 2010/0252802 A1* | 10/2010 | Numata | B82Y 10/00 257/9 |
| 2011/0122559 A1* | 5/2011 | Lee | B32B 17/061 361/679.01 |
| 2013/0002583 A1* | 1/2013 | Jin | G06F 1/1637 345/173 |
| 2013/0088662 A1* | 4/2013 | Watanabe | G02F 1/133308 349/58 |
| 2014/0002385 A1* | 1/2014 | Ka | G06F 1/1601 345/173 |

FOREIGN PATENT DOCUMENTS

| | | |
|---|---|---|
| CN | 202153541 U | 2/2012 |
| CN | 102683389 A | 9/2012 |
| CN | 102969320 A | 3/2013 |
| CN | 203397058 U | 1/2014 |
| CN | 10346611 A | 3/2014 |
| JP | 2005084228 A | 3/2005 |
| JP | 5071152 B2 | 11/2012 |

OTHER PUBLICATIONS

Chinese Office Action dated Apr. 3, 2015 regarding Chinese Application No. 201310397916.0. Translation provided by Dragon Intellectual Property Law Firm.
Written Opinion of the International Searching Authority for international application No. PCT/CN2014/075262.

* cited by examiner

ARRAY SUBSTRATE, FLEXIBLE DISPLAY DEVICE AND METHOD FOR MANUFACTURING ARRAY SUBSTRATE

CROSS-REFERENCE TO RELATED APPLICATION

This application is the U.S. national phase of PCT Application No. PCT/CN2014/075262 filed on Apr. 14, 2014, which claims priority to Chinese Patent Application No. 201310397916.0 filed on Sep. 4, 2013, the disclosures of which are incorporated in their entirety by reference herein.

TECHNICAL FIELD

The present disclosure relates to flexible display, in particular to an array substrate, a flexible display device and a method for manufacturing an array substrate.

BACKGROUND

Flexible displays refers to an ultrathin, oversized and foldable display device obtained by using a flexible substrate or a display technology thereof, and as the most essential features, it is thin, light and flexible.

Figure 1:
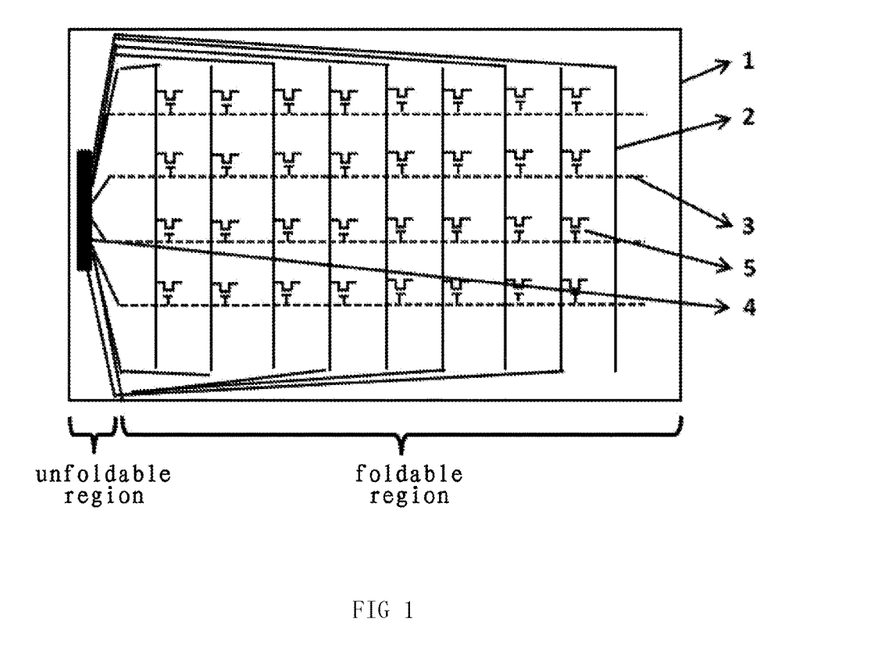
FIG. 1 is a schematic view showing a current flexible array substrate.

Generally, a current flexible substrate includes two regions, i.e., an unfoldable region (which is usually located at a peripheral region of the flexible substrate) and a foldable region. As shown in FIG. 1, a region of an array substrate 1 where a driving module 4 is arranged is the unfoldable region. The driving module 4 is connected to a data line 2 and a gate line 3, so as to drive a thin film transistor TFT 5 arranged in a panel. So, the region of the array substrate where the driving module 4 is arranged is required to be of certain strength so as not to be foldable readily.

Figure 2:
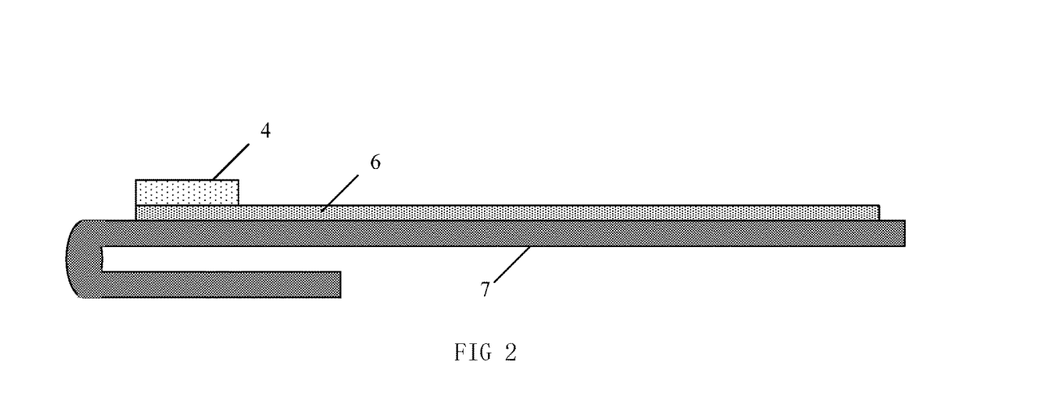
FIG. 2 is a sectional view showing the current flexible array substrate.

As shown in FIG. 2, a currently-used method includes arranging the driving module 4 on an array layer 6.

Briefly, in the embodiments of the present disclosure, the array layer just refers to a display structure on the array substrate, and it generally includes the gate line, an insulating layer, the data line, the TFT, and so on.

As shown in FIG. 2, in the currently-used method, the flexible substrate 7 is foldable at its ends, and this is equivalent to the arrangement of two layers of flexible substrate at its periphery. Although with the enhanced strength, there are at least the following defects in this method, i.e., an additional folding process is required and it is difficult to ensure a flat surface at the folded region.

SUMMARY

An object of the present disclosure is to provide an array substrate, a flexible display device and a method for manufacturing an array substrate, so as to ensure the strength of an unfoldable region in a simple and reliable manner.

In one aspect, the present disclosure provides an array substrate, including a flexible substrate arranged at a display region and a peripheral region, and an array layer formed on the flexible substrate. The flexible substrate arranged at the display region has a first thickness, and at least a portion of the flexible substrate arranged at the peripheral region has a second thickness greater than the first thickness.

In the array substrate, the portion of the flexible substrate arranged at the peripheral region and having the second thickness can extend to the display region.

The array substrate further includes a driving module arranged above the portion of the flexible substrate arranged at the peripheral region and having the second thickness, and the driving module is configured to drive the array layer.

In the array substrate, the portions having the second thickness are arranged at two opposite sides of the flexible substrate, respectively.

In another aspect, the present disclosure provides a flexible display device including any one of the above-mentioned array substrate.

In yet another aspect, the present disclosure provides a method for manufacturing an array substrate, including:

providing a base plate, an upper surface of which includes at least one concave structure arranged at its edge;

forming a flexible substrate arranged at a display region and a peripheral region on the upper surface of the base plate, wherein a portion of the flexible substrate corresponding to the concave structure being a portion of the flexible substrate arranged at the peripheral region and having a second thickness greater than a first thickness of the flexible substrate arranged at the display region; and forming an array layer on the flexible substrate.

In the method, the portion of the flexible substrate corresponding to the concave structure and having the second thickness extends to the display region.

The method further includes:

providing a driving module for driving the array layer above the portion of the flexible substrate arranged at the peripheral region and having the second thickness, so as to obtain the array substrate.

The method further includes:

removing the array substrate from the base plate.

In the method, the concave structures are arranged at two opposite sides of the base plate, respectively.

In the method, the concave structures are arranged symmetrically at the two opposite sides of the base plate, respectively.

According to the array substrate of the present disclosure, the flexible substrate arranged at the peripheral region is provided with a thickened portion so as to meet the strength requirement of the unfoldable region. Meanwhile, the thickened portion can be formed in a single process through the base plate having the corresponding concave structure, and as a result, it is able to reduce the process complexity.

DETAILED DESCRIPTION

According to an array substrate, a flexible display device and a method for manufacturing the array substrate of the present disclosure, an integrally-formed thickened portion is arranged at a peripheral region of the array substrate, so as to ensure the strength of an unfoldable region. As a result, it is able to ensure the product quality while reducing the process complexity.

Figure 3:
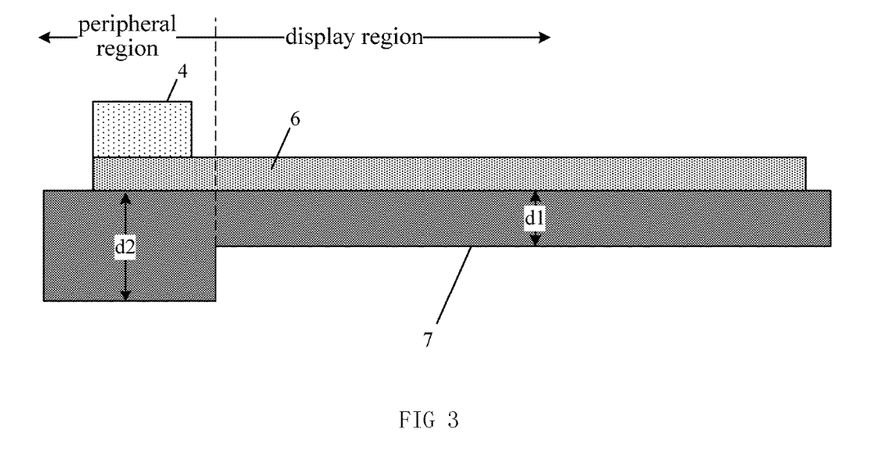
FIGS. 3-10 are sectional views showing a flexible array substrate according to the embodiments of the present disclosure.

As shown in FIG. 3, an array substrate of the present disclosure includes a flexible substrate 7 arranged at a display region and a peripheral region, and an array layer 6 formed on the flexible substrate 7. The flexible substrate arranged at the display region has a first thickness d1, and at least a portion of the flexible substrate arranged at the peripheral region has a second thickness d2 greater than the first thickness d1.

As shown in FIG. 3, in the array substrate of the present disclosure, the flexible substrate 7 arranged at the peripheral region is provided with a thickened portion so as to meet the strength requirement of the unfoldable region. Meanwhile, the thickened portion can be formed in a single process through the base plate having a corresponding concave structure, and as a result, it is able to reduce the process complexity.

It should be appreciated that, in FIG. 2, all portions of the flexible substrate are of the same thickness, merely with some portions being folded.

It should be further appreciated that, in an alternative embodiment of the present disclosure, the at least one portion of the flexible substrate arranged at the peripheral region has the second thickness d2 greater than the first thickness d1, and this merely means that the flexible substrate arranged at the peripheral region is provided with the thickened portion, but does not mean that the thickened portion is merely provided at the flexible substrate arranged at the peripheral region.

Figure 4:
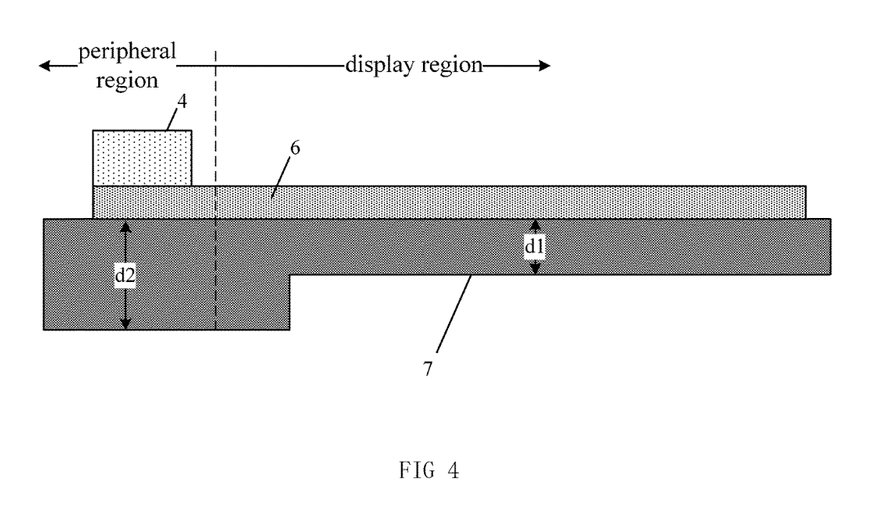

As shown in FIG. 4, which is a schematic view showing another array substrate according to one embodiment of the present disclosure, the thickened portion covers the peripheral region and meanwhile extends to the display region.

It should be further appreciated that, in an alternative embodiment of the present disclosure, the at least one portion of the flexible substrate arranged at the peripheral region has the second thickness d2 greater than the first thickness d1, and this merely means that the flexible substrate arranged at the peripheral region is provided with the thickened portion, but does not mean that the entire flexible substrate arranged at the peripheral region has the second thickness d2.

Figure 5:
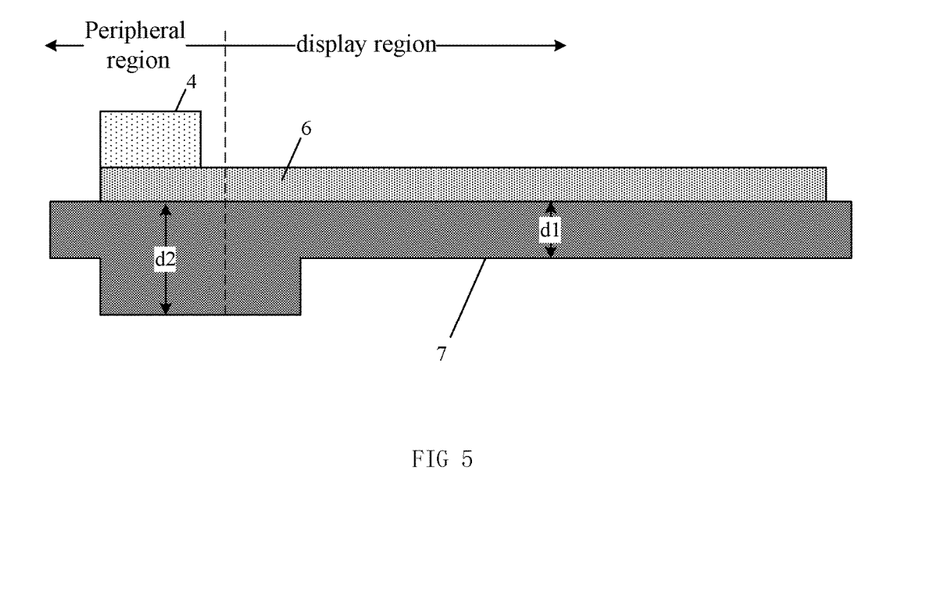

As shown in FIG. 5, which is a schematic view showing yet another array substrate according to one embodiment of the present disclosure, the thickened portion merely covers a part of the peripheral region and meanwhile extends to the display region.

Figure 6:
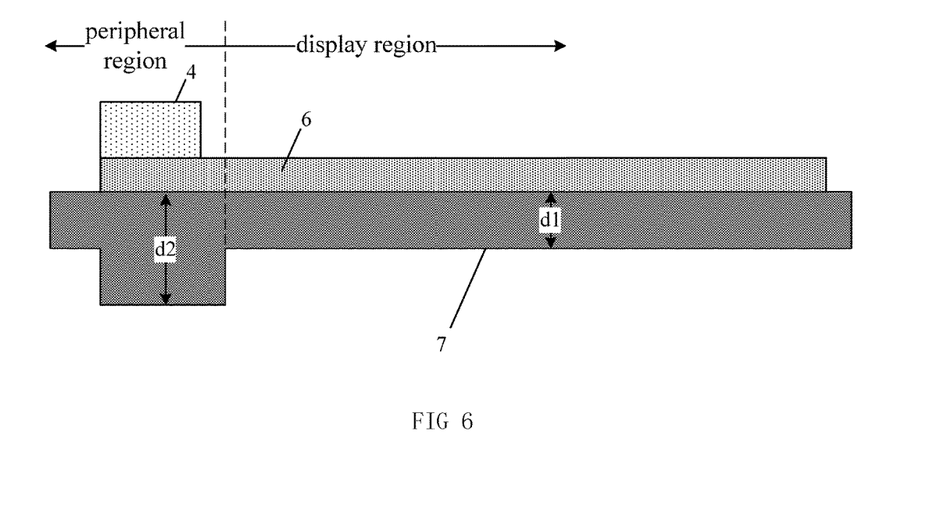

As shown in FIG. 6, which is a schematic view showing still yet another array substrate according to one embodiment of the present disclosure, the thickened portion merely covers a part of the peripheral region but does not extend to the display region.

Figure 7:
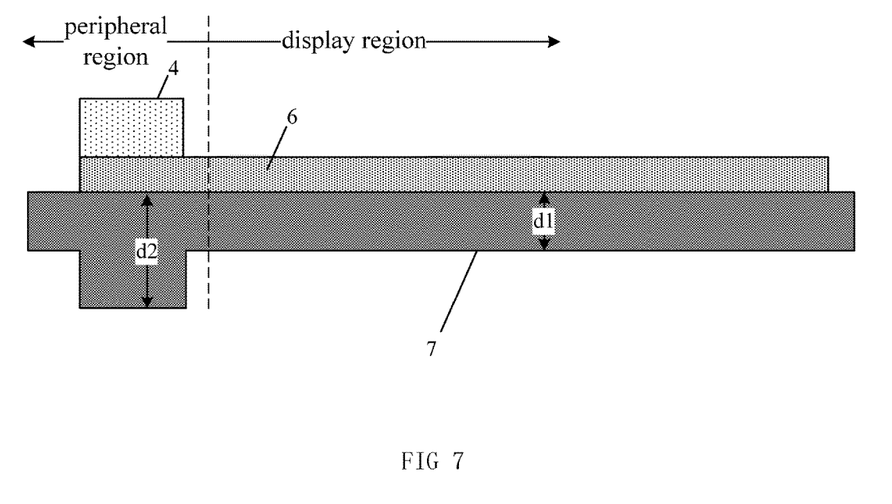

As shown in FIG. 7, which is a schematic view showing still yet another substrate according to one embodiment of the present disclosure, the thickened portion merely covers a middle part of the flexible substrate arranged at the peripheral region.

In an alternative embodiment, the thickened portion may be merely arranged at one side of the flexible substrate, or the thickened portions may be arranged at two opposite sides of the flexible substrate, respectively, i.e., the portions having the second thickness may be arranged at the two opposite sides of the flexible substrate, respectively.

The array substrate further includes a driving module arranged above the portion of the flexible substrate arranged at the peripheral region and having the second thickness, and configured to drive the array layer.

Figure 8:
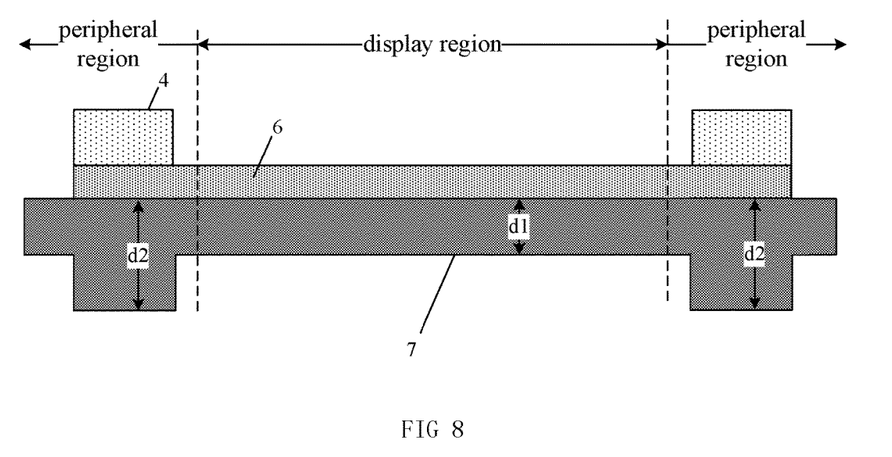

As shown in FIG. 8, when the portions having the second thickness are arranged at the two opposite sides of the array substrate, respectively, two driving modules 4 may be arranged at the two opposite sides of the array substrate, so as to drive the array layer in a more flexible manner.

However, it should be appreciated that, the portion having the second thickness may also be used to thicken the other parts, e.g., a bezel region, of the flexible substrate arranged at the peripheral region, which is not particularly defined herein.

Figure 9:
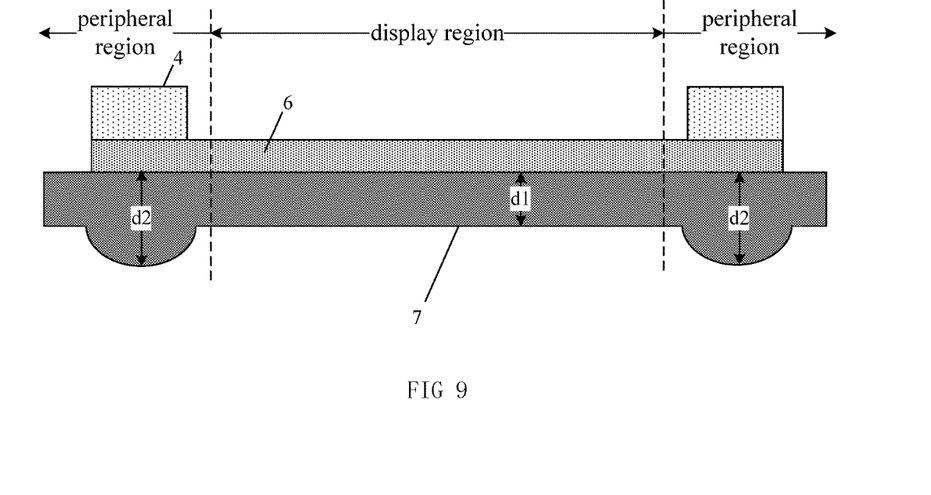
Figure 10:
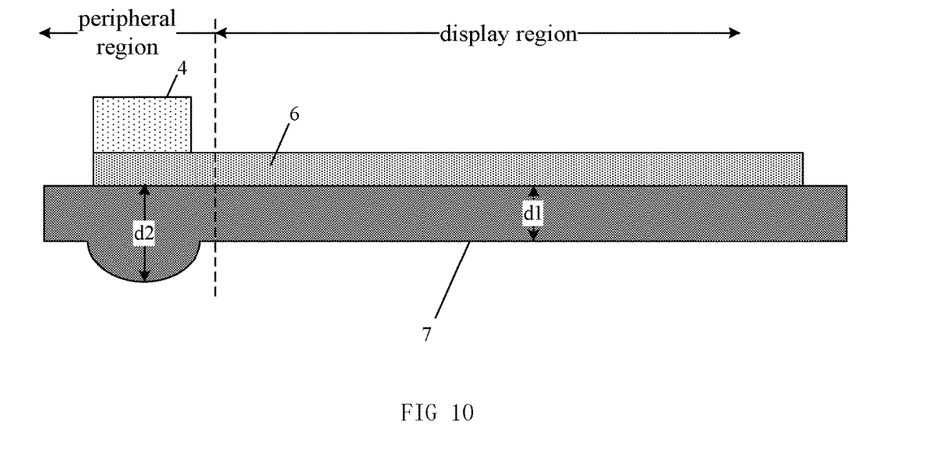

In addition, in FIGS. 3-8, a step-like shape is formed between the thickened portion and an unthickened portion. Alternatively, the thickened portion may have a continuously variable thickness, as shown in FIGS. 9 and 10.

It should be appreciated that, there may be one or more thickened portions, and the thickened portion may be of a trapezoidal or triangular shape, which are not particularly defined herein.

The present disclosure further provides a flexible display device including any one of the above-mentioned array substrates. The structure and working principle of the array substrate are mentioned in the above embodiments and will not be repeated herein. In addition, the structures of the other parts of the flexible display device may refer to the prior art, which are not particularly defined herein. The flexible display device may be any product or member having a display function, such as a liquid crystal panel, an electronic paper, a liquid crystal TV, a liquid crystal display, a digital photo frame, a mobile phone and a tablet PC.

Figure 11A:
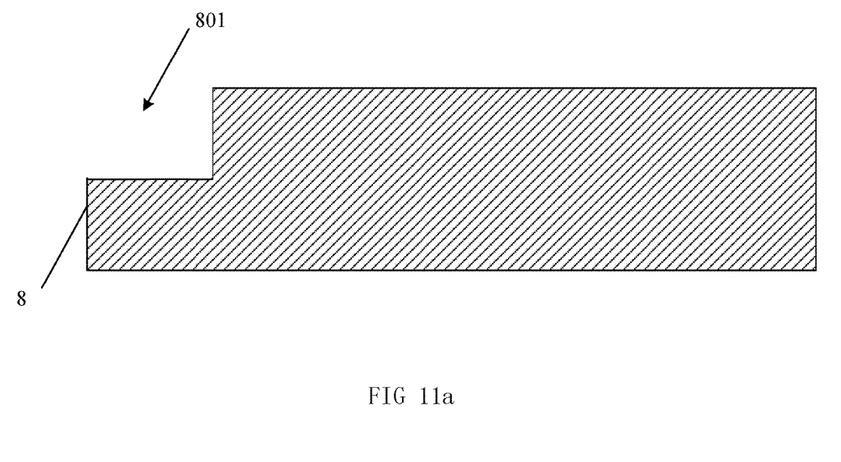
FIGS. 11a-11e are flow charts of a method for manufacturing the array substrate according to one embodiment of the present disclosure.
Figure 11B:
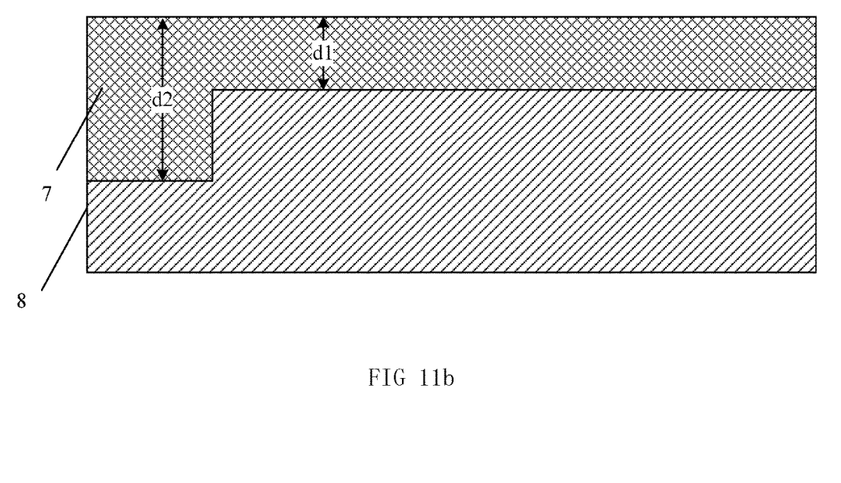
Figure 11C:
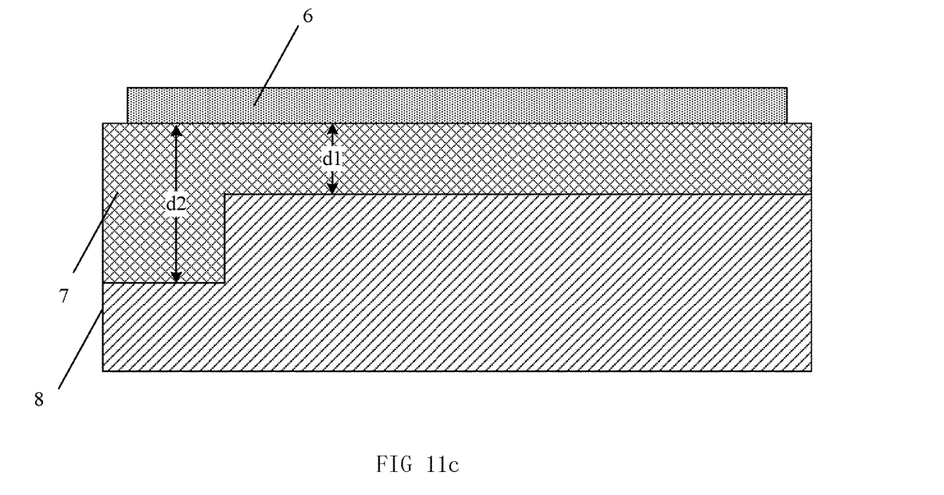

As shown in FIGS. 11a-11e, a method for manufacturing an array substrate includes:

Step A1: providing a base plate 8, an upper surface of which includes at least one concave structure 801 arranged at its edge;

Step A2: forming the flexible substrate 7 arranged at the display region and the peripheral region on the upper surface of the base plate, a portion of the flexible substrate 7 corresponding to the concave structure being a portion of the flexible substrate arranged at the peripheral region and having the second thickness d2 greater than the first thickness d1 of the flexible substrate arranged at the display region; and Step A3: forming the array layer 6 on the flexible substrate 7.

Alternatively, the portion of the flexible substrate 7 corresponding to the concave structure and having the second thickness d2 extends to the display region.

When the flexible substrate is formed by coating, an upper surface of the entire flexible substrate 7 is flat. Due to the concave structure 801 of the base plate 8, the flexible substrate 7 will be provided with a thickened portion at a position corresponding to the concave structure 801, and the strength of the thickened portion will be greater than that of the portion having the first thickness d1, so it is able to meet the strength requirement of the unfoldable region. Meanwhile, the thickened portion may be formed by providing the base plate with the concave structure, and no additional process is required, so the implementation thereof is very simple.

In an alternative embodiment of the present disclosure, the thickened portion may be merely arranged at one side of the array substrate, or the thickened portions may be arranged at two opposite sides of the array substrate, respectively, i.e., the portions having the second thickness may be arranged at the two opposite sides of the array substrate, respectively.

Of course, the thickened portions may also be arranged at more sides of the array substrate, which is not particularly defined herein.

In order to protect the driving module, in an alternative embodiment of the present disclosure, the driving module is arranged above the portion of the flexible substrate arranged at the peripheral region and having the second thickness.

Figure 11D:
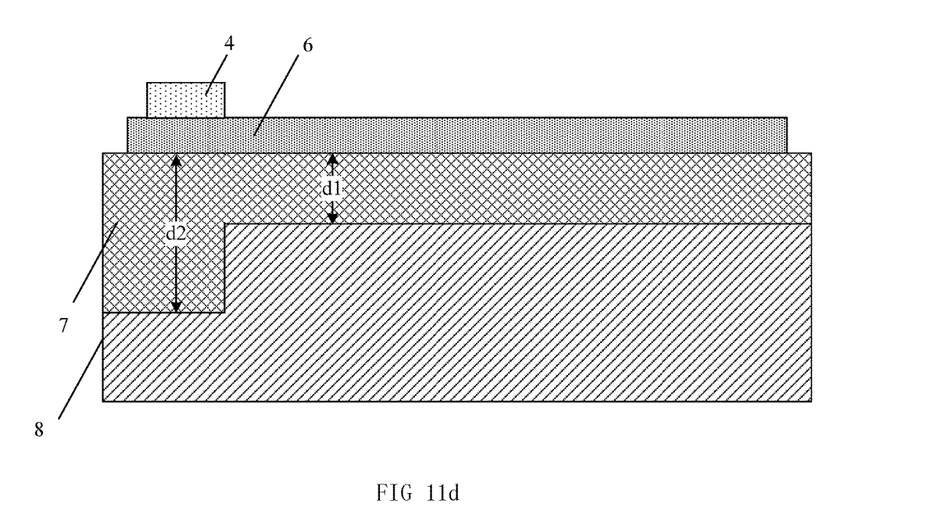

In other words, as shown in FIG. 11d, the method further includes:

Step A4: providing the driving module 4 above the portion of the flexible substrate 7 arranged at the peripheral region and having the second thickness d2, so as to obtain the array substrate. As shown in FIG. 11d, because the driving module 4 is arranged above the thickened portion of the flexible substrate 7 and due to greater thickness the thickened portion provides better strength and is difficult to be folded, it is able to protect the driving module in a better manner.

Figure 11E:
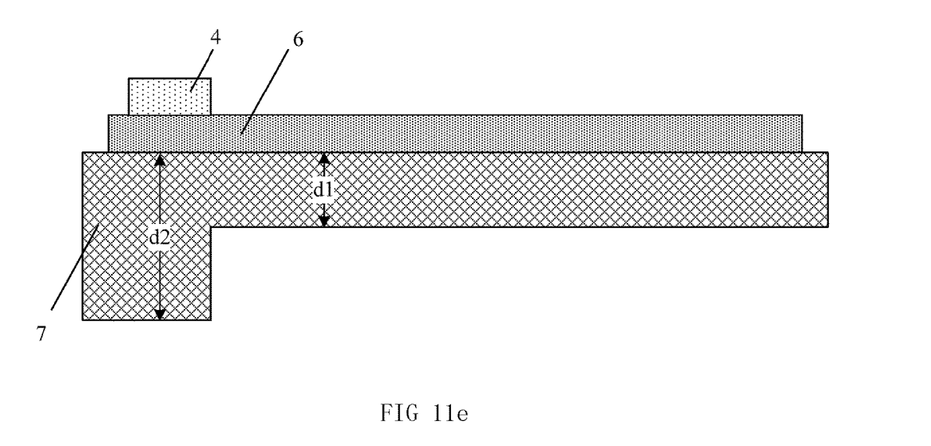

Subsequent to forming the array substrate on the base plate, the array substrate is removed from the base plate, and finally the array substrate as shown in FIG. 11e is obtained.

Of course, in the driving module, a gate driving module for driving a gate line may be formed together with the array layer in a gate-on-array (GOA) manner.

In the above-mentioned embodiments, one thickened structure arranged at a position corresponding to the driving module is taken as an example. It should be appreciated that, the thickened structure may also be arranged at any other position, and there may be more than one thickened structures. For example, in an alternative embodiment of the present disclosure, the concave structures may be arranged at two opposite sides of the base plate, respectively.

In an alternative embodiment of the present disclosure, the concave structures may be arranged symmetrically at the two opposite sides of the base plate, respectively.

During the manufacture, the positions and number of the concave structures may be selected in accordance with the positions and number of the thickened structures, which is not particularly defined herein.

In an alternative embodiment, the base plate may be made of various materials suitable to form the flexible substrate and easy to be removed. Alternatively the base plate is a glass base plate which can be used repeatedly.

The above are merely the alternative embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a flexible substrate having a portion arranged at a display region and a portion arranged at a peripheral region, and an array layer formed on the flexible substrate,
   wherein the flexible substrate is formed of a single layer, the portion of the flexible substrate arranged at the display region has a first thickness, and
   at least the portion of the flexible substrate arranged at the peripheral region has a second thickness greater than the first thickness, the second thickness being a continuously variable thickness.

2. The array substrate according to claim 1, further comprising a driving module arranged above the portion of the flexible substrate arranged at the peripheral region and having the second thickness, wherein the driving module is configured to drive the array layer.

3. The array substrate according to claim 2, wherein two portions having the second thickness are arranged at two opposite sides of the flexible substrate, respectively.

4. The array substrate according to claim 1, wherein two portions having the second thickness are arranged at two opposite sides of the flexible substrate, respectively.

5. A flexible display device comprising the array substrate according to claim 1.

6. The array substrate according to claim 1,
   further comprising a driving module arranged above the portion of the flexible substrate arranged at the peripheral region and having the second thickness, wherein the driving module is configured to drive the array layer.

7. The array substrate according to claim 6, wherein two portions having the second thickness arranged at two opposite side of the flexible substrate, respectively.

8. The array substrate according to claim 1,
   wherein two portions having the second thickness are arranged at two opposite sides of the flexible substrate, respectively.

9. A method for manufacturing an array substrate, comprising:
   providing a base plate, an upper surface of the base plate comprises at least one concave structure arranged at its edge;
   forming a flexible substrate arranged at a display region and a peripheral region on the upper surface of the base plate, a portion of the flexible substrate corresponding to the concave structure being a portion of the flexible substrate arranged at the peripheral region and having a second thickness greater than a first thickness of the flexible substrate arranged at the display region; and
   forming an array layer on the flexible substrate,
   wherein the array substrate comprises a flexible substrate having a portion arranged at a display region and a portion arranged at a peripheral region, and an array layer formed on the flexible substrate,
   wherein the flexible substrate is formed of a single layer, the portion of the flexible substrate arranged at the display region has a first thickness, and at least the portion of the flexible substrate arranged at the peripheral region has a second thickness greater than the first thickness, and
   wherein the second thickness is a continuously variable thickness.

10. The method according to claim 9, further comprising:
    providing a driving module for driving the array layer above the portion of the flexible substrate arranged at the peripheral region and having the second thickness, so as to obtain the array substrate.

11. The method according to claim 10, wherein subsequent to obtaining the array substrate, the method further comprises:
    removing the array substrate from the base plate.

12. The method according to claim 10, wherein the concave structures are arranged at two opposite sides of the base plate, respectively.

13. The method according to claim 11, wherein the concave structures are arranged at two opposite sides of the base plate, respectively.

14. The method according to claim 9, wherein the concave structures are arranged at two opposite sides of the base plate, respectively.

15. The method according to claim 14, wherein the concave structures are arranged symmetrically at the two opposite sides of the base plate, respectively.

16. The method according to claim 9, further comprising:
    providing a driving module for driving the array layer above the portion of the flexible substrate arranged at the peripheral region and having the second thickness, so as to obtain the array substrate.

17. The method according to claim 9, wherein the concave structures are arranged at two opposite sides of the base plate, respectively.

18. The method according to claim 16, wherein the concave structures are arranged at two opposite sides of the base plate, respectively.

* * * * *